(12) United States Patent
Hodono

(10) Patent No.: US 8,388,239 B2
(45) Date of Patent: Mar. 5, 2013

(54) MANUFACTURING METHOD OF OPTO-ELECTRIC HYBRID MODULE AND OPTO-ELECTRIC HYBRID MODULE MANUFACTURED THEREBY

(75) Inventor: Masayuki Hodono, Ibaraki (JP)

(73) Assignee: Nitto Denko Corporation, Ibaraki-shi, Osaka (JP)

(*) Notice: Subject to any disclaimer, the term of this patent is extended or adjusted under 35 U.S.C. 154(b) by 215 days.

(21) Appl. No.: 12/579,874

(22) Filed: Oct. 15, 2009

(65) Prior Publication Data

US 2010/0104246 A1     Apr. 29, 2010

Related U.S. Application Data

(60) Provisional application No. 61/114,260, filed on Nov. 13, 2008.

(30) Foreign Application Priority Data

Oct. 28, 2008  (JP) .................................. 2008-276671

(51) Int. Cl.
    G02B 6/36          (2006.01)
(52) U.S. Cl. ......................................................... 385/88
(58) Field of Classification Search .................. None
    See application file for complete search history.

(56) References Cited

U.S. PATENT DOCUMENTS

| | | | |
|---|---|---|---|
| 4,735,677 A | 4/1988 | Kawachi et al. | |
| 4,750,799 A | 6/1988 | Kawachi et al. | |
| 5,125,054 A | 6/1992 | Ackley et al. | |
| 6,793,405 B1 | 9/2004 | Murata et al. | |
| 6,829,398 B2 | 12/2004 | Ouchi | |
| 6,877,912 B2 * | 4/2005 | Cho et al. .......................... 385/88 |
| 7,149,376 B2 | 12/2006 | Uchida et al. | |
| 7,163,598 B2 | 1/2007 | Okubora et al. | |
| 7,306,689 B2 | 12/2007 | Okubora et al. | |
| 7,310,457 B2 * | 12/2007 | Kotake ............................. 385/14 |
| 2003/0039455 A1 | 2/2003 | Ouchi | |
| 2004/0033029 A1 * | 2/2004 | Kondo .............................. 385/88 |
| 2004/0042705 A1 | 3/2004 | Uchida et al. | |

(Continued)

FOREIGN PATENT DOCUMENTS

| | | |
|---|---|---|
| CN | 1402030 A | 3/2003 |
| EP | 1020747 A1 | 7/2000 |

(Continued)

OTHER PUBLICATIONS

European Office Action dated Jul. 14, 2011, issued in corresponding European Patent Application No. 09172411.2.

(Continued)

*Primary Examiner* — Sarah Hahm
(74) *Attorney, Agent, or Firm* — Westerman, Hattori, Daniels & Adrian, LLP

(57) ABSTRACT

An opto-electric hybrid module manufacturing method which suppresses a cost loss, and to provide an opto-electric hybrid module manufactured by the method. An opto-electric hybrid module is produced by separately preparing a first board for a middle portion having an optical waveguide extending from one end to the other end of the board, a second board for a light emitting end portion having a light emitting element and an optical waveguide connectable to one end of the optical waveguide of the middle portion and a third board for a light receiving end portion having a light receiving element and an optical waveguide connectable to the other end of the optical waveguide of the middle portion, checking the second and third boards for light transmission, and connecting second and third boards judged to be acceptable to the first board.

2 Claims, 6 Drawing Sheets

U.S. PATENT DOCUMENTS

| | | | |
|---|---|---|---|
| 2004/0096152 | A1 | 5/2004 | Nakama et al. |
| 2004/0264838 | A1 | 12/2004 | Uchida et al. |
| 2006/0188201 | A1 | 8/2006 | Kotake |
| 2009/0269704 | A1 | 10/2009 | Hodono |

FOREIGN PATENT DOCUMENTS

| | | |
|---|---|---|
| EP | 1286194 A2 | 2/2003 |
| EP | 2112534 A1 | 10/2009 |
| JP | 2000-199827 A | 7/2000 |

OTHER PUBLICATIONS

European Search Report dated Feb. 11, 2010, issued in corresponding European Patent Application No. 09172411.2.

Chinese Office Action dated May 23, 2012, issued in corresponding Chinese Patent Application No. 200910178000.X.

Japanese Office Action dated Jul. 17, 2012, issued in corresponding Japanese Patent Application No. 2008-276671, (6 pages). With English Translation.

English Abstract and Machine Translation of Japanese Publication No. 2003-131081, dated May 8, 2003, (16 pages). Cited in Japanese Office Action dated Jul. 17, 2012.

English Abstract and Machine Translation of Japanese Publication No. 2004-233894, dated Aug. 19, 2004, (18 pages). Cited in Japanese Office Action dated Jul. 17, 2012.

English Abstract and Machine Translation of Japanese Publication No. 2005-321588 dated Nov. 17, 2005, (21 pages). Cited in Japanese Office Action dated Jul. 17, 2012.

English Abstract and Machine Translation of Japanese Publication No. 2003-140061 dated May 14, 2003, (13 pages). Cited in Japanese Office Action dated Jul. 17, 2012.

English Abstract and Machine Translation of Japanese Publication No. 2004-012889 dated Jan. 15, 2004, (16 pages). Cited in Japanese Office Action dated Jul. 17, 2012.

\* cited by examiner

PRIOR ART

MANUFACTURING METHOD OF OPTO-ELECTRIC HYBRID MODULE AND OPTO-ELECTRIC HYBRID MODULE MANUFACTURED THEREBY

RELATED APPLICATIONS

This application claims the benefit of U.S. Provisional Application No. 61/114,260, filed Nov. 13, 2008, which is hereby incorporated by reference.

BACKGROUND OF THE INVENTION

1. Field of the Invention

The present invention relates to a method of manufacturing an opto-electric hybrid module including an optical waveguide and an electric circuit mounted with an optical element, and to an opto-electric hybrid module manufactured by the method.

2. Description of the Related Art

As shown in FIG. 7, an exemplary method of manufacturing an opto-electric hybrid module is such that an electric circuit board 80 and an optical waveguide unit 70 are separately prepared and bonded together by an adhesive agent 90, and a light emitting element 23 and a light receiving element 33 are respectively mounted in association with opposite ends of the optical waveguide unit 70 on the electric circuit board 80 (see, for example, JP-A-2000-199827). The electric circuit board 80 includes an electric circuit 82 provided on one surface (an upper surface in FIG. 7) of a stainless steel plate 81 with an insulating layer (not shown) in-between and having mount pads 82a on which the light emitting element 23 and the light receiving element 33 are mounted. The optical waveguide unit 70 includes an over-cladding layer 73, a core 72 and an under-cladding layer 71 provided in this order on the other surface (a lower surface in FIG. 7) of the stainless steel plate 81. The optical waveguide unit 70 has surfaces inclined at 45 degrees with respect to its optical axis at its opposite ends. End faces of the core 72 located in the inclined surfaces respectively serve as light reflection surfaces 72a, 72b. The opto-electric hybrid module has a light transmission through-hole 81a formed in the electric circuit board 80 in association with the light emitting element 23 so that light (optical signal) L emitted from the light emitting element 23 can be inputted into one end portion of the core 72 adjacent to the light emitting element 23. Further, the opto-electric hybrid module has a light transmission through-hole 81b formed in the electric circuit board 80 in association with the light receiving element 33 so that light L emitted from the light emitting element 23, then passing through the core of the optical waveguide unit 70 and reflected on the light reflection surface 72b adjacent to the light receiving element 33 can be received by the light receiving element 33. In FIG. 7, a reference character 23a denotes a bump (electrode) of the light emitting element 23, and a reference character 33a denotes a bump (electrode) of the light receiving element 33.

The light L is transmitted in the following manner in the opto-electric hybrid module. First, the light L is outputted downward from the light emitting element 23. The light L passes through one end portion (a left end portion in FIG. 7) of the over-cladding layer 73 of the optical waveguide unit 70 to be inputted into the one end portion of the core 72. Then, the light L is reflected on the light reflection surface 72a at the one end of the core 72 to be transmitted axially through the core 72. The light L passes through the core 72 to the other end (a right end in FIG. 7) of the core 72. Then, the light L is reflected upward on the light reflection surface 72b at the other end to be outputted through the over-cladding layer 73 and received by the light receiving element 33.

DISCLOSURE OF THE INVENTION

The opto-electric hybrid module is checked for the light transmission state and the mounted states and the operation states of the light emitting element 23 and the light receiving element 33 after the production thereof and, if the module is judged to be defective, the defective module is discarded. This results in a great loss, because materials for the optical waveguide unit 70 are very expensive.

In view of the foregoing, it is an object of the present invention to provide an opto-electric hybrid module manufacturing method which suppresses a cost loss, and to provide an opto-electric hybrid module manufactured by the method.

According to a first aspect of the present invention to achieve the aforementioned object, there is provided an opto-electric hybrid module manufacturing method for manufacturing an opto-electric hybrid module including a middle portion, a light emitting end portion provided on one of opposite sides of the middle portion, and a light receiving end portion provided on the other side of the middle portion, the method including the steps of: preparing a first board having an optical waveguide extending from one end to the other end thereof for the middle portion; preparing a second board for the light emitting end portion, the second board having a light emitting element and an optical waveguide connectable to one end of the optical waveguide of the first board; preparing a third board for the light receiving end portion, the third board having a light receiving element and an optical waveguide connectable to the other end of the optical waveguide of the first board; checking if light emitted from the light emitting element is outputted from an end of the optical waveguide of the second board and, if the outputted light is detected, attaching the second board to the one side of the first board to connect the optical waveguide of the second board to the optical waveguide of the first board; and checking if light inputted from an end of the optical waveguide of the third board is received by the light receiving element and, if the received light is detected, attaching the third board to the other side of the first board to connect the optical waveguide of the third board to the optical waveguide of the first board.

According to a second aspect of the present invention, there is provided an opto-electric hybrid module in which the optical waveguides of the second and third boards are connected to the ends of the optical waveguide of the first board with their opposite side edges being positioned by positioning guides.

In the inventive opto-electric hybrid module manufacturing method, the first board for the middle portion of the opto-electric hybrid module, the second board for the light emitting end portion to be provided on the one side of the first board, and the third board for the light emitting end portion to be provided on the other side of the first board are separately prepared. Before the first, second and third boards are combined together to produce the opto-electric hybrid module, the second board for the light emitting end portion and the third board for the light receiving end portion are checked for light transmission between the optical elements (the light emitting element and the light receiving element) and the optical waveguides thereof. If the light transmission is judged to be normal in the check, the second board and the third board are respectively attached to the left and right sides of the first board, so that the optical waveguides of the second board and the third board are respectively connected to the opposite ends of the optical waveguide of the first board. On the other hand, if the light transmission is judged to be abnormal in the check, the second board and the third board are not attached to the left and right sides of the first board. In the inventive opto-electric hybrid module manufacturing method, only the second board and the third board judged to be defective in the check are discarded. Therefore, drastic cost reduction can be achieved without the possibility that the first board is wastefully connected to the second and third boards.

Particularly, where the second and third boards each have an alignment mark provided at a predetermined position with respect to the optical waveguide thereof and the alignment mark is referred to for mounting the light emitting element and the light receiving element, the light emitting element and the light receiving element can be mounted in proper positional relation with respect to the optical waveguides of the second and third boards. This improves the light transmission between the light emitting and receiving elements and the optical waveguides. Therefore, the numbers of second and third boards judged to be defective are drastically reduced when the second and third boards are checked for the light transmission. As a result, the waste of materials and the cost loss can be drastically suppressed.

Where the positioning guides for positioning the opposite side edges of the optical waveguides of the second and third boards are provided on the first board and the optical waveguides of the second and third boards are connected to the optical waveguide of the first board by using the positioning guides, the connection of the optical waveguides is facilitated. This ensures proper connection and hence proper light transmission between the optical waveguide of the first board and the optical waveguides of the second and third boards.

In the inventive opto-electric hybrid module, the optical waveguides of the second and third boards are connected to the ends of the optical waveguide of the first board with their opposite side edges being positioned by the positioning guides. This ensures proper light transmission between the optical waveguide of the first board and the optical waveguides of the second and third boards.

Next, embodiments of the present invention will be described in detail with reference to the drawings.

Figure 1:
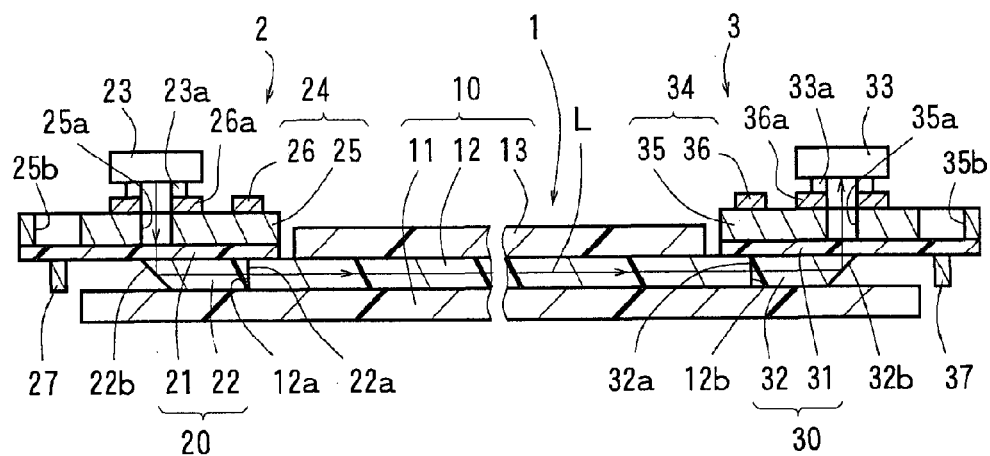
FIG. 1 is a longitudinal sectional view schematically illustrating an opto-electric hybrid module produced by an opto-electric hybrid module manufacturing method according to an embodiment of the present invention.
Figure 2:
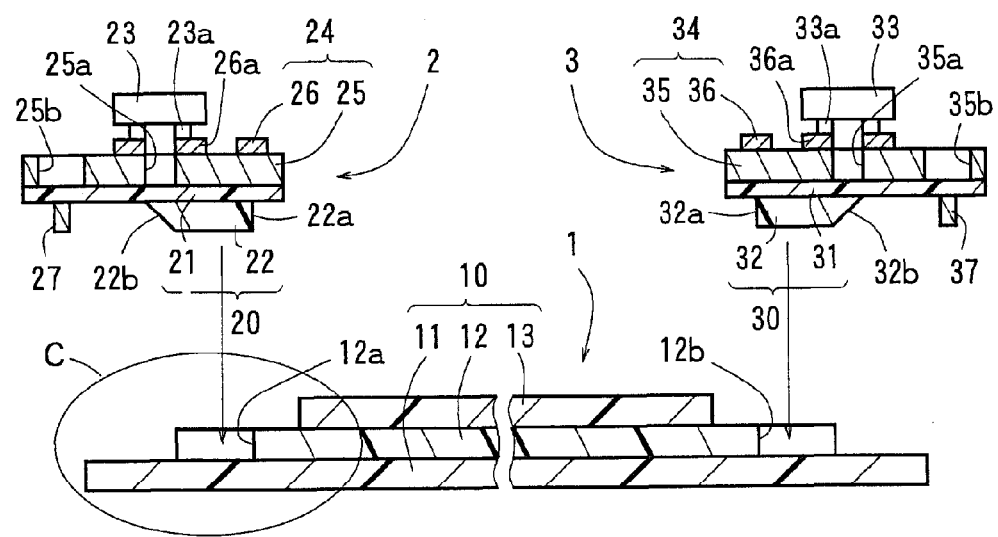
FIG. 2 is an explanatory diagram schematically showing the opto-electric hybrid module manufacturing method according to the embodiment of the present invention.

FIG. 1 illustrates an opto-electric hybrid module manufactured by an opto-electric hybrid module manufacturing method according to an embodiment of the present invention. The opto-electric hybrid module includes a middle portion 1, a light emitting end portion 2 provided on one of opposite sides of the middle portion 1, and a light receiving end portion 3 provided on the other side of the middle portion 1. The middle portion 1 is defined by a first board which includes an optical waveguide 10 extending from one end to the other end thereof. The light emitting end portion 2 is defined by a second board which includes an optical waveguide 20 connected to one end of the optical waveguide 10 of the middle portion 1, a light emitting element 23 that emits light L toward the optical waveguide 20, and an electric circuit board 24 formed with the optical waveguide 20 and mounted with the light emitting element 23. The light receiving end portion 3 is defined by a third board which includes an optical waveguide 30 connected to the other end of the optical waveguide 10 of the middle portion 1, a light receiving element 33 that receives light L from the optical waveguide 30, and an electric circuit board 34 formed with the optical waveguide 30 and mounted with the light receiving element 33. The first board for the middle portion 1, the second board for the light emitting end portion 2 and the third board for the light receiving end portion 3 are separately prepared as shown in FIG. 2. Then, the second and third boards are checked for light transmission. If the second and third boards are judged to be acceptable in the check, the second and third boards are connected to the first board. Thus, the opto-electric hybrid module is provided.

Figure 3:
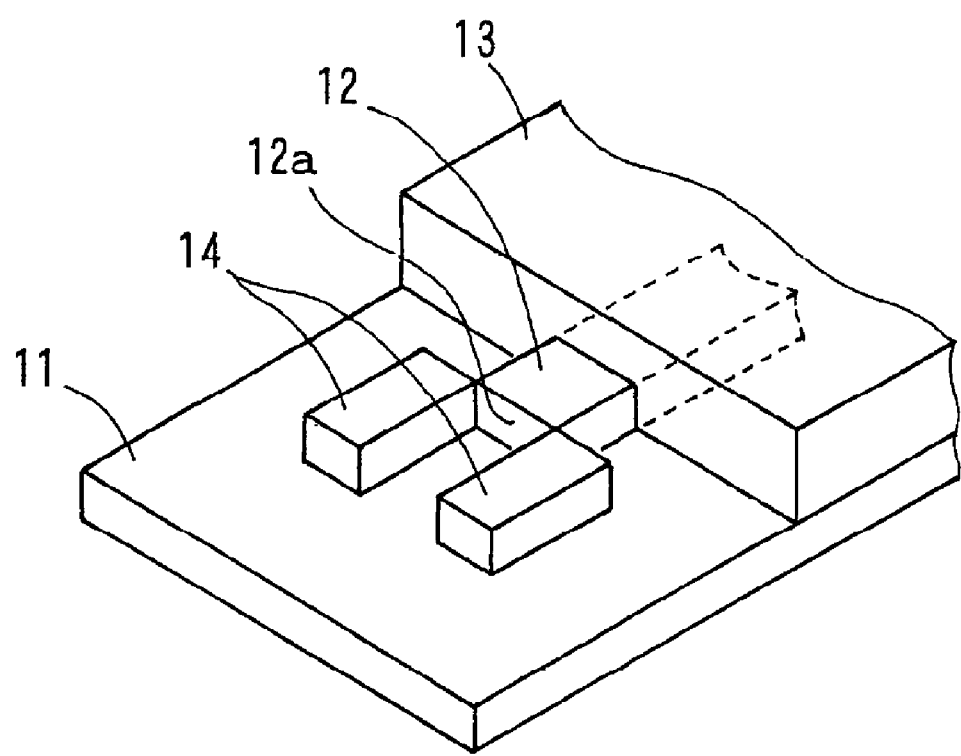
FIG. 3 is a perspective view schematically illustrating an end portion of a core of a first board for a middle portion of the opto-electric hybrid module surrounded by an oval C in FIG. 2.

More specifically, the first board for the middle portion 1 (defined by the optical waveguide 10) includes an under-cladding layer 11, a core 12 provided in a predetermined pattern on a surface of the under-cladding layer 11, and an over-cladding layer 13 provided over the under-cladding layer 11 as covering a portion of the core 12 except for its opposite end portions. Opposite end faces 12a, 12b of the core 12 are perpendicular to the under-cladding layer 11 and exposed to be brought into intimate contact with end cores 22, 32 of the second and third boards. In this embodiment, as shown in FIG. 3, positioning guides 14 each including a pair of elongated parallel projections are provided on opposite sides of the core 12 along extensions of opposite side edges of the core 12 on the surface of the under-cladding layer 11. With the use of these positioning guides 14, the second and third boards can be easily attached to the first board (see FIG. 2). In FIG. 3, a reference character 12a denotes the end face of the core 12, and a reference character 13 denotes the over-cladding layer.

The electric circuit board 24 serving as a principal member of the second board for the light emitting end portion 2 has the same width as the under-cladding layer 11 shown in FIG. 3, and includes an electric circuit 26 provided on one surface (an upper surface in FIG. 2) of a stainless steel plate 25 with the intervention of an insulating layer (not shown). The electric circuit 26 has a mount pad 26a, on which the light emitting element 23 is mounted. A through-hole 25a for light transmission to the optical waveguide 20 is provided in the stainless steel plate 25 in association with the light emitting element 23. The optical waveguide 20 includes an end cladding layer 21 provided on the other surface (a lower surface in FIG. 2) of the stainless steel plate 25, and an end core 22 provided on a surface (a lower surface in FIG. 2) of the end cladding layer 21. The end core 22 has an elongated plate shape so as to be accommodated in a space defined between the paired elongated parallel projections of the positioning guide 14, and is provided on a middle portion of a rear surface of the electric circuit board 24 as extending longitudinally. The end core 22 has exposed opposite end faces, one of which is defined as a connection surface 22a to be connected to the exposed end face 12a of the core 12 of the optical waveguide 10 of the first board for the middle portion 1 and is perpendicular to the electric circuit board 24. The other end face of the end core 22 is positioned below the light emitting element 23 and the light transmission through-hole 25a, and inclined at 45 degrees with respect to the electric circuit board 24. The inclined surface serves as a light reflection surface 22b, which reflects the light L (see FIG. 1) emitted from the light emitting element 23 toward the one end face (connection surface 22a) of the end core 22. In this embodiment, an alignment mark 27 having a cross shape as seen in plan is provided at a predetermined position apart from the end core 22 on the surface (the lower surface in FIG. 2) of the end cladding layer 21. The light emitting element 23 is mounted at a predetermined position with reference to the alignment mark 27. A through-hole 25b is provided in a portion of the electric circuit board 24 above the alignment mark 27. The alignment mark 27 is detected from the above through the through-hole 25b and the end cladding layer 21 by a camera A (see FIG. 6D) of amounting device, whereby the light emitting element 23 is mounted in position with reference to the alignment mark 27. A VCSEL (vertical cavity surface emitting laser) or the like is used as the light emitting element 23. In FIG. 2, a reference character 23a denotes a bump (electrode) of the light emitting element 23.

The third board for the light receiving end portion 3 has substantially the same construction as the second board for the light emitting end portion 2, except that the light receiving element 33 is mounted instead of the light emitting element 23. In the third board for the light receiving end portion 3, more specifically, the electric circuit board 34 includes an electric circuit 36 provided on one surface (an upper surface in FIG. 2) of a stainless steel plate 35 with the intervention of an insulating layer (not shown). The light receiving element 33 is mounted on a mount pad 36a which is a part of the electric circuit 36. A through-hole 35a for light transmission from the optical waveguide 30 is provided in the stainless steel plate 35 in association with the light receiving element 33. The optical waveguide 30 is provided on the other surface (a lower surface in FIG. 2) of the stainless steel plate 35, and includes an end cladding layer 31 and an end core 32. The end core 32 has an exposed end face, which is defined as a connection surface 32a to be connected to the other exposed end face 12b of the core 12 of the first board for the middle portion 1 and is perpendicular to the electric circuit board 34. The other exposed end face of the end core 32 is positioned below the light receiving element 33 and the light transmission through-hole 35a, and inclined at 45 degrees with respect to the electric circuit board 34. The inclined surface serves as a light reflection surface 32b, which reflects light L (see FIG. 1) inputted into the end core 32 from the one end face (connection surface 32a) of the end core 32 toward the light receiving element 33. In this embodiment, an alignment mark 37 having a cross plan shape to be used as a positioning reference when the light receiving element 33 is mounted is provided at a predetermined position apart from the end core 32 on the surface (the lower surface in FIG. 2) of the end cladding layer 31. A through-hole 35b through which the alignment mark 37 is checked from the above is provided in a portion of the electric circuit board 34 above the alignment mark 37. The light receiving element 33 is mounted in position with reference to the alignment mark 37. A PD (photo diode) or the like is used as the light receiving element 33. In FIG. 2, a reference character 33a denotes a bump (electrode) of the light receiving element 33.

The end cores 22, 32 of the second and third boards judged to be acceptable in the optical check are positioned in spaces defined between the paired elongated parallel projections of the respective positioning guides 14 of the first board, and the exposed end faces (connection surfaces 22a, 32a) of the end cores 22, 32 are respectively connected to the opposite exposed end faces 12a, 12b of the core 12 of the first board, whereby the inventive opto-electric hybrid module is produced.

The light is transmitted in the opto-electric hybrid module in the following manner. As shown in FIG. 1, the light L emitted from the light emitting element 23 of the second board passes through the light transmission through-hole 25a provided in the electric circuit board 24 and then through the end cladding layer 21, and is inputted into the other end portion of the end core 22. In turn, the light L is reflected on the light reflection surface (inclined surface) 22b of the end core 22 to be transmitted through the end core 22 to the one end face (connection surface 22a) of the end core 22. Then, the light L from the end core 22 passes axially through the core 12 of the optical waveguide 10 of the first board to be inputted into the end core 32 through the one end face (connection surface 32a) of the end core 32 of the third board. Subsequently, the light L is reflected upward on the light reflection surface (inclined surface) 32b of the end core 32 and passes through the end cladding layer 31 to be outputted. Then, the light L passes through the light transmission through-hole 35a provided in the electric circuit board 34, and is received by the light receiving element 33.

The opto-electric hybrid module according to this embodiment is produced through the following steps (1) to (4):

(1) preparing the first board for the middle portion 1 of the opto-electric hybrid module (see FIGS. 4A to 4D);

(2) preparing the second board for the light emitting end portion 2 to be provided in one end portion of the opto-electric hybrid module and preparing the third board for the light receiving end portion 3 to be provided in the other end portion of the opto-electric hybrid module (see FIGS. 5A to 5D and FIGS. 6A to 6D);

(3) checking if the light L emitted from the light emitting element 23 (see FIG. 1) is outputted from the one end face (connection surface 22a) of the end core 22 of the second board, and checking if the light L inputted into the one end face (connection surface 32a) of the end core 32 of the third board (see FIG. 1) is received by the light receiving element 33; and (4) attaching the second and third boards judged to be acceptable in the check to the opposite sides of the first board so as to connect the exposed end faces (connection surfaces 22a, 32a) of the end cores 22, 32 of the optical waveguides 20, 30 of the second and third boards to the exposed opposite end faces 12a, 12b of the core 12 of the optical waveguide 10 of the first board (see FIG. 2).

The step (1) of preparing the first board for the middle portion 1 will be described. First, a planar base 15 (see FIG. 4A) to be used for formation of the optical waveguide 10 of the first board is prepared. Exemplary materials for the base 15 include glass, quartz, silicon, resins and metals. The base 15 has a thickness of, for example, 20 µm to 5 mm.

Figure 4A:
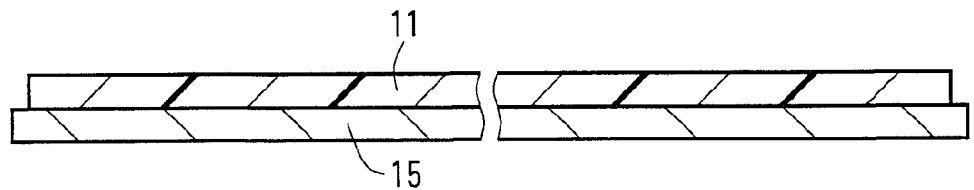
FIGS. 4A to 4D are explanatory diagrams schematically showing the step of forming an optical waveguide of a first board.

In turn, as shown in FIG. 4A, the under-cladding layer 11 is formed in a predetermined surface region of the base 15. The formation of the under-cladding layer 11 is achieved, for example, in the following manner. A varnish prepared by dissolving a photosensitive resin such as a photosensitive epoxy resin in a solvent for the formation of the under-cladding layer 11 is applied onto the predetermined surface region of the base 15 and, as required, heat-treated (at 50° C. to 120° C. for about 10 to about 30 minutes) to be dried. Thus, a photosensitive resin layer is formed for the formation of the under-cladding layer 11. Then, the photosensitive resin layer is exposed to radiation such as ultraviolet radiation, whereby the under-cladding layer 11 is formed. The under-cladding layer 11 typically has a thickness of 1 to 50 μm, preferably 5 to 30 μm.

Figure 4B:
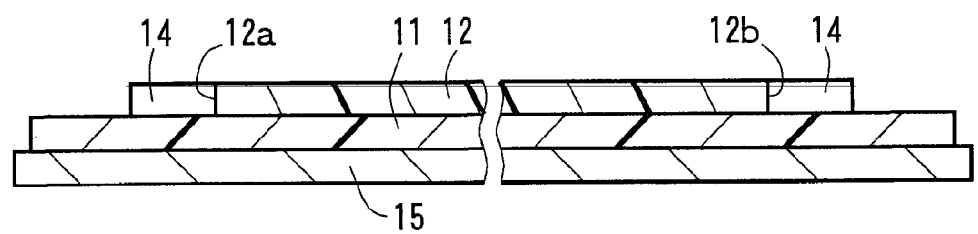

Then, as shown in FIG. 4B, the core 12 and the elongated positioning guides 14 are formed in a predetermined pattern on the surface of the under-cladding layer 11. The formation of the core 12 and the positioning guides 14 is achieved, for example, by a photolithography method. A photosensitive resin layer having a core formation region and positioning guide formation regions is formed on the surface of the under-cladding layer 11 in substantially the same manner as in the formation of the photosensitive resin layer for the under-cladding layer 11. In turn, a photomask formed with an opening pattern for the core 12 and the positioning guides 14 is placed on the photosensitive resin layer, and portions of the photosensitive resin layer defined by the opening pattern is exposed to radiation via the photomask. The photosensitive resin layer is heat-treated, and then developed with the use of a developing solution, whereby an unexposed portion of the photosensitive resin layer is dissolved away. Thus, portions of the photosensitive resin layer remaining on the under-cladding layer 11 have a pattern for the core 12 and the positioning guides 14. Then, the developing solution remaining in the surface of the photosensitive resin layer is removed by a heat treatment. Thus, the resulting photosensitive resin layer portions respectively serve as the core 12 and the positioning guides 14. The material for the core 12 has a higher refractive index than the material for the under-cladding layer 11 and a material for the over-cladding layer 13 (see FIG. 4C) to be described later. The refractive index may be adjusted, for example, by selection of the types of the materials for the under-cladding layer 11, the core 12 and the over-cladding layer 13 and adjustment of the composition ratio. The core 12 typically has a thickness of 5 to 150 μm, preferably 5 to 100 μm. The core 12 typically has a width of 5 to 150 μm, preferably 5 to 100 μm. The positioning guides 14 typically each have the same thickness as that of the core 12. The positioning guides 14 typically each have a width of 50 to 2000 μm, preferably 300 to 500 μm. The paired elongated parallel projections of each of the positioning guides 14 are spaced from each other by a distance which is typically equivalent to or slightly greater (by 10 μm or less) than the width of the end cores 22, 32 of the second and third boards (see FIG. 2). The positioning guides 14 typically each have a length of 5 to 20 mm. The core 12 and the positioning guides 14 may be formed as a unitary member, or may be formed as separate members (in FIG. 3, these are formed as the unitary member). Where the core 12 and the positioning guides 14 are formed as separate members, the end faces 12a, 12b of the core 12 are typically spaced a distance of not greater than 100 μm from the end faces of the positioning guides 14.

Figure 4C:
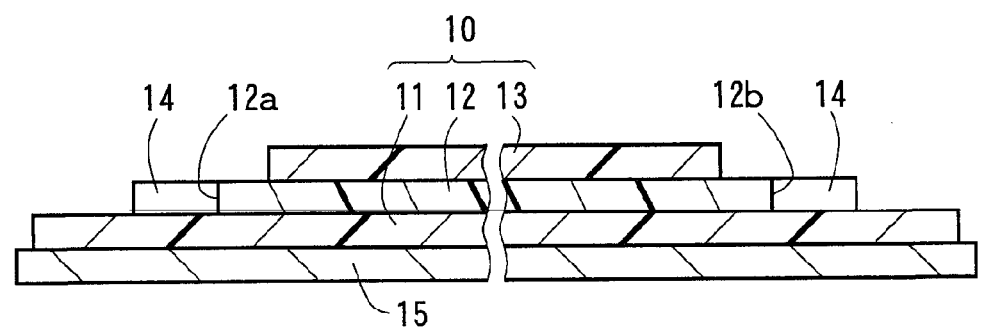

Then, as shown in FIG. 4C, the over-cladding layer 13 is formed over the under-cladding layer 11 so as to cover a portion of the core 12 excluding the positioning guides 14 and the opposite end portions of the core 12. The formation of the over-cladding layer 13 is achieved through formation, exposure and a heat treatment of a photosensitive resin layer, which are carried out in substantially the same manner as in the formation of the under-cladding layer 11. The over-cladding layer 13 typically has a thickness of 5 to 100 μm, preferably 10 to 80 μm (as measured from a surface of the core 12).

Figure 4D:
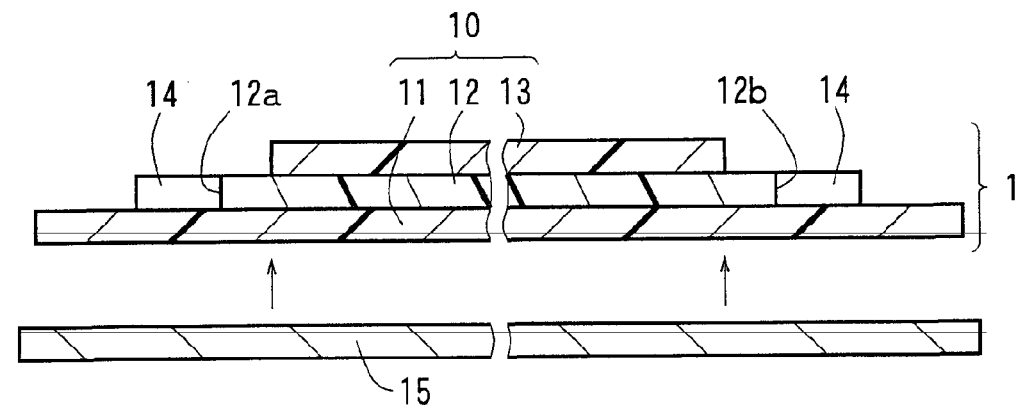

Thus, the optical waveguide 10 of the first board for the middle portion 1 is formed on the surface of the base 15. Thereafter, as shown in FIG. 4D, the optical waveguide 10 is separated from the base 15. Thus, the step (1) of preparing the first board for the middle portion 1 is completed.

Next, the preparation of the second board for the light emitting end portion 2 in the step (2) will be described. First, the stainless steel plate 25 for the electric circuit board 24 of the second board is prepared (see FIG. 5A). The stainless steel plate 25 typically has a thickness of 20 to 200 μm.

An insulating layer (not shown) of a predetermined pattern is formed on a predetermined portion of one surface (an upper surface in FIG. 5A) of the stainless steel plate 25 by a photolithography method. The insulating layer is formed on a surface portion except for portions of the stainless steel plate 25 to be formed with the through-hole 25a for the light transmission and the through-hole 25b for checking the alignment mark 27 in the subsequent step (see FIG. 5B). That is, the formation of the insulating layer is achieved, for example, in the following manner. First, a photosensitive resin such as a photosensitive epoxy resin is applied onto the predetermined portion of the one surface (the upper surface in FIG. 5A) of the stainless steel plate 25 to form a photosensitive resin layer. In turn, the photosensitive resin layer is exposed to radiation via a photomask formed with an opening pattern conformal to the insulating layer pattern. Then, the photosensitive resin layer is developed with the use of a developing solution, whereby an unexposed portion of the photosensitive resin layer is dissolved away. Thus, a remaining portion of the photosensitive resin layer has the insulating layer pattern. Thereafter, the developing solution remaining in the surface of the photosensitive resin layer is removed by a heat treatment. Thus, the resulting photosensitive resin layer portion is defined as the insulating layer. The insulating layer typically has a thickness of 5 to 15 μm.

Figure 5A:
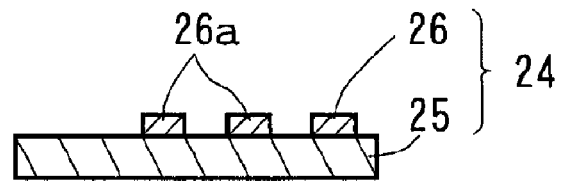
FIGS. 5A to 5D are explanatory diagrams schematically showing a first half of the step of preparing a second board for a light emitting end portion of the opto-electric hybrid module

Subsequently, as shown in FIG. 5A, the electric circuit 26 including the mount pad 26a is formed in a predetermined pattern on a surface of the insulating layer. That is, the formation of the electric circuit 26 is achieved, for example, in the following manner. First, a metal layer (having a thickness of about 600 to about 2600 Å) is formed on the surface of the insulating layer by sputtering, electroless plating or the like. The metal layer serves as a seed layer (a base layer for formation of an electrolytic plating layer) to be utilized for the subsequent electrolytic plating. After dry resist films are bonded onto opposite surfaces of a laminate including the stainless steel plate 25, the insulating layer and the metal layer (seed layer), a trench having a pattern conformal to the pattern of the electric circuit 26 is formed in one of the dry resist films formed on the metal layer by a photolithography method to expose a surface portion of the metal layer in the bottom of the trench. In turn, the electrolytic plating layer (having a thickness of about 5 to about 20 μm) is formed on the surface portion of the metal layer exposed in the bottom of the trench by electrolytic plating. Then, the dry resist films are removed by a sodium hydroxide aqueous solution or the like. Thereafter, a portion of the metal layer not formed with the electrolytic plating layer is removed by soft etching. Thus, a laminate portion including the remaining electrolytic plating layer and the underlying metal layer is defined as the electric circuit 26.

Figure 5B:
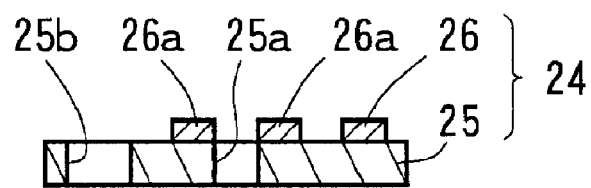

In turn, as shown in FIG. 5B, the through-hole 25a for the light transmission and the through-hole 25b for checking the alignment mark 27 (see FIG. 2) are formed in the predetermined portions of the stainless steel plate 25 by etching or the like. The light transmission through-hole 25a is formed at a position associated with the light reflection surface (inclined surface) 22b of the end core 22 to be formed in the subsequent end core formation step, and the alignment mark checking through-hole 25b is formed at a position associated with the alignment mark 27 to be formed in the vicinity of the end core 22 in the subsequent end core formation step. That is, the formation of these through-holes 25a, 25b are achieved, for example, in the following manner. First, dry resist films are bonded onto opposite surfaces of a laminate including the stainless steel plate 25, the insulating layer and the electric circuit 26, and then pattern openings for the through-holes 25a, 25b are formed in one of the dry resist films on a side not formed with the insulating layer by a photolithography method, whereby portions of the other surface (the lower surface in FIG. 5B) of the stainless steel plate 25 are exposed in the bottoms of the openings of the dry resist film. Subsequently, the portions of the stainless steel plate 25 exposed in the bottoms of the openings are etched with the use of a ferric chloride aqueous solution. Thus, the light transmission through-hole 25a and the alignment mark checking through-hole 25b are formed in the stainless steel plate 25. The diameter of the light transmission through-hole 25a is properly determined according to the design of the light emitting element 23, but is typically in the range of 0.05 to 0.2 mm. The diameter of the alignment mark checking through-hole 25b is properly determined according to the size of the alignment mark 27, but is typically in the range of 0.1 to 3.0 mm. Thus, the electric circuit board 24 of the second board for the light emitting end portion 2 is prepared.

Figure 5C:
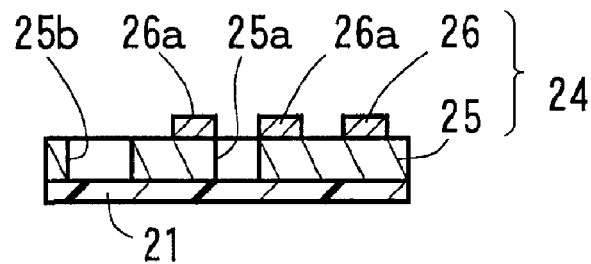

Then, as shown in FIG. 5C, the end cladding layer 21 is formed on the other surface (the lower surface in FIG. 5C) of the stainless steel plate 25 of the electric circuit board 24. The formation of the end cladding layer 21 is achieved through formation, exposure and a heat treatment of a photosensitive resin layer, which are carried out in substantially the same manner as in the formation of the under-cladding layer 11 of the optical waveguide 10 in the step (1) of preparing the first board for the middle portion 1. The end cladding layer 21 typically has a thickness of 1 to 50 μm, preferably 5 to 30 μm. The end cladding layer 21 typically has a length generally equal to that (about 5 to about 20 mm) of each of the positioning guides 14 (see FIG. 2).

Figure 5D:
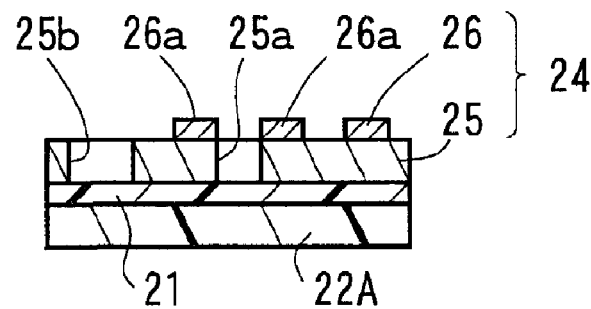
Figure 6A:
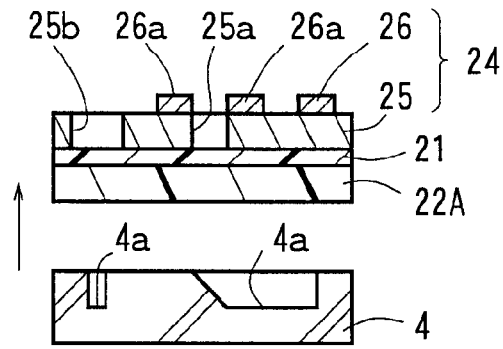
FIGS. 6A to 6D are explanatory diagrams schematically showing a second half of the step of preparing the second board.
Figure 6B:
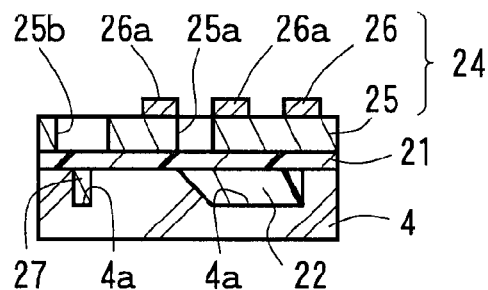
Figure 6C:
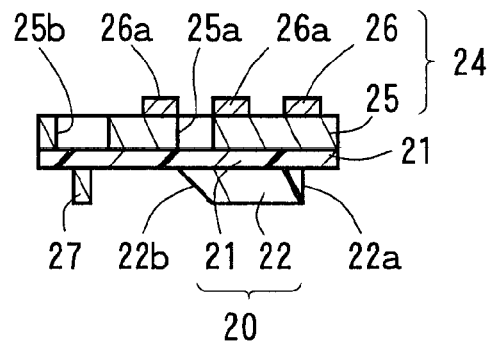

Subsequently, as shown in FIG. 5D, a photosensitive resin layer 22A having an end core formation region (see FIG. 2) and an alignment mark formation region (see FIG. 2) is formed on the surface (the lower surface in FIG. 5D) of the end cladding layer 21. The formation of the photosensitive resin layer 22A is achieved in substantially the same manner as the formation of the photosensitive resin layer for the formation of the under-cladding layer 11 (see FIG. 4A). Then, as shown in FIG. 6A, a molding die 4 for forming the end core 22 and the alignment mark 27 in predetermined shapes by press-molding is prepared. The molding die 4 is composed of a material (e.g., quartz) transmissive to radiation such as ultraviolet radiation, and has molding surfaces (recesses) 4a conformal to the surface geometries of the end core 22 and the alignment mark 27. Then, as shown in FIG. 6B, the molding die 4 is pressed against the photosensitive resin layer 22A so that the molding surfaces 4a of the molding die 4 are positioned in predetermined positional relation with respect to the light transmission through-hole 25a and the alignment mark checking through-hole 25b formed in the electric circuit board 24. Thus, the photosensitive resin layer 22A is shaped into the end core 22 and the alignment mark 27. In this state, the photosensitive resin layer is exposed to radiation such as ultraviolet radiation through the molding die 4, and then heat-treated. The exposure and the heat treatment are carried out in the same manner as in the formation of the under-cladding layer 11 (see FIG. 4A). Thereafter, as shown in FIG. 6C, the resulting product is demolded. Thus, the end core 22 and the alignment mark 27 are formed. The end core 22 and the alignment mark 27 are thus simultaneously formed by the press molding employing the single molding die 4 and, therefore, can be located in the predetermined positional relation. The thickness and the width of the end core 22 are equal to those of the core 12 of the optical waveguide 10 of the first board for the middle portion 1. The alignment mark 27 typically has a cross shape. The alignment mark 27 typically has a thickness of 5 to 60 μm, a cross line width of 20 to 200 μm, and a cross length and width of 200 to 1000 μm.

Figure 6D:
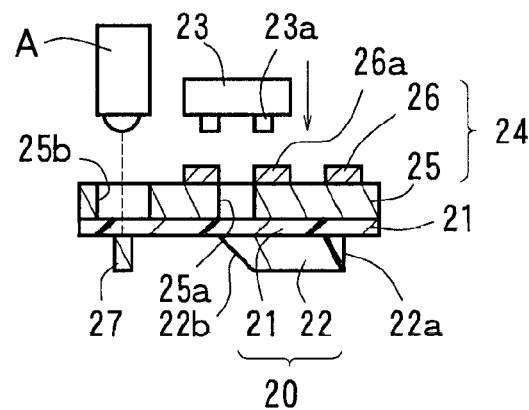
Figure 7:
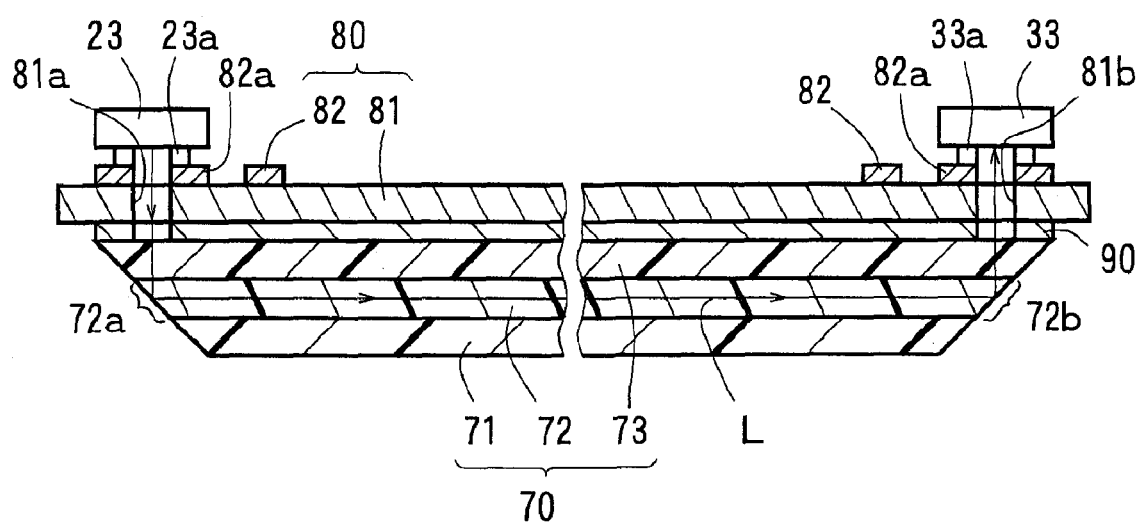
FIG. 7 is an explanatory diagram schematically illustrating a prior-art opto-electric hybrid module.

Then, as shown in FIG. 6D, the light emitting element 23 is mounted on the mount pad 26a of the electric circuit 26. The mounting of the light emitting element 23 is achieved, for example, in the following manner. First, the electric circuit board 24 is placed on a stage of a mounting device with its electric circuit formation surface facing up. Then, the alignment mark 27 is detected through the end cladding layer 21 and the alignment mark checking through-hole 25b by the camera A of the mounting device. Thus, the mounting device computes the position of the light reflection surface 22b of the end core 22 with reference to the alignment mark 27. Then, the light emitting element 23 is mounted on the mount pad 26a as covering the light transmission through-hole 25a from the above with the optical axis thereof aligning with the computed position of the light reflection surface 22b. Thus, the preparation of the second board for the light emitting end portion 2 (see FIG. 2) in the step (2) is completed.

The preparation of the third board for the light receiving end portion 3 in the step (2) is achieved in substantially the same manner as the preparation of the second board for the light emitting end portion 2, except that the light receiving element 33 is mounted instead of the light emitting element 23. Thus, the preparation of the third board for the light receiving end portion (see FIG. 2) in the step (2) is completed.

In the step of checking the second board for the light emitting end portion 2 in the step (3), as shown in FIG. 2, an electric signal is first applied to the electric circuit 26 of the second board to cause the light emitting element 23 to emit light L (see FIG. 1). Then, it is checked if the light L is outputted from the one end face of the end core 22 (the connection surface 22a to be connected to the one end face 12a of the core 12 of the first board for the middle portion 1). If the outputted light L is detected, the second board is judged to be acceptable. On the other hand, if the outputted light L is not detected, the second board is judged to be defective with improper light transmission between the light emitting element 23 and the end core 22 due to malfunction or improper mounting of the light emitting element 23.

In the step of checking the third board for the light receiving end portion 3 in the step (3), as shown in FIG. 2, light L (see FIG. 1) is inputted to the one end face of the end core 32 of the third board (the connection surface 32a to be connected to the other end face 12b of the core 12 of the first board for the middle portion 1). Then, it is checked if an electric signal is outputted to the electric circuit 36 from the light receiving element 33. If the electric signal is detected, the third board is judged to be acceptable. On the other hand, if the electric signal is not detected, the third board is judged to be defective with improper light transmission between the light receiving element 33 and the end core 32 due to malfunction or improper mounting of the light receiving element 33.

In turn, as shown in FIG. 2, the second and third boards judged to be acceptable in the checking step (3) are attached to the opposite sides of the first board prepared in the step (1) so as to connect the exposed end faces (the connection surfaces 22a, 32a) of the end cores 22, 32 of the second and third boards to the opposite exposed end faces 12a, 12b of the core 12 of the first board (in the connecting step (4)). For the connection, the end cores 22, 32 of the second and third boards are positioned in the spaces between the paired elongated parallel projections of the respective positioning guides 14 of the first board. For example, a die bonder is used for the attachment and the connection. Where the second and third boards are fixed to the first board after the connection, the same type of photosensitive resin as used for the under-cladding layer 11 (see FIG. 4A) is preferably applied around the connected portions and exposed to radiation such as ultraviolet radiation. Thus, the connected portions are covered with the photosensitive resin to be thereby protected from physical damages. With the end cores being thus clad, the optical waveguides each have an ordinary structure. Thus, the intended opto-electric hybrid module is completed.

In the embodiment described above, the second board for the light emitting end portion 2 and the third board for the light receiving end portion 3 are prepared separately from the first board for the middle portion 1 of the opto-electric hybrid module, so that the second and third boards can be checked for the light transmission before the completion of the opto-electric hybrid module. This prevents production of a defective opto-electric hybrid module (complete product) which may otherwise occur when the second or third board judged to be defective in the check is connected to the first board.

In the embodiment described above, the positioning guides 14 and the core 12 are simultaneously formed of the same material in the first board for the middle portion 1, but different materials maybe used for the positioning guides 14 and the core 12. Further, the positioning guides 14 and the core 12 are not necessarily required to be simultaneously formed. The positioning guides 14 may be obviated in some cases.

In the embodiment described above, the alignment mark 27, 37 and the end core 22, 32 are simultaneously formed of the same material in the second board for the light emitting end portion 2 or in the third board for the light receiving end portion 3, but different materials may be used for the alignment mark 27, 37 and the end core 22, 32. Further, the alignment mark 27, 37 and the end core 22, 32 are not necessarily required to be simultaneously formed. The alignment marks 27, 37 may be eliminated in some cases.

In the embodiment described above, the formation of the end core 22, 32 and the alignment mark 27, 37 is achieved by the press molding with the use of the molding die 4 in the preparation of the second or third board, but may be achieved by a photolithography method. That is, the photosensitive resin layers 22A each including the end core formation region and the alignment mark formation region are each exposed to radiation via a photo mask formed with an opening pattern for the end core 22, 32 and the alignment mark 27, 37, and then developed and heat-treated.

In the embodiment described above, the optical element (the light emitting element 23 or the light receiving element 33) and the optical waveguide 20, 30 are disposed on the opposite surfaces of the electric circuit board 24, 34 of the second or third board, but maybe disposed on the same surface of the electric circuit board 24, 34. In this case, the other end face of the end core 22, 32 is not defined as the light reflection surface (inclined surface) 22a, 32b, but is defined as the light input or output end face (perpendicular to the electric circuit board 24, 34).

In the embodiment described above, the stainless steel plate 25, 35 is used for the preparation of the electric circuit board 24, 34, but a plate of other metal material or a resin material may be used. Where the plate is insulative, there is no need to form the insulating layer, but the electric circuit 26, 36 may be formed directly on the plate. The insulating layer prevents a short circuit between the electric circuit 26, 36 and the metal plate or other electrically conductive plate.

In the embodiment described above, the end cladding layer 21, 31 is provided in the second or third board. The end core 22, 32 and the alignment mark 27, 37 may be provided directly on the stainless steel plate 25, 35 or the like without the provision of the end cladding layer 21, 31.

In the embodiment described above, the optical waveguide 10 of the first board is formed on the surface of the base 15, and then separated from the base 15. Alternatively, the optical waveguide 10 formed on the base 15 may be used as it is without the separation. In the embodiment described above, the surface of the over-cladding layer 13 of the first board (optical waveguide 10) is uncovered, but may be provided with an electric circuit board. In this case, an available space can be effectively used.

An inventive example will hereinafter be described. However, the present invention is not limited to the example.

EXAMPLE

Under-Cladding Layer Material and Over-Cladding Layer Material for First Board and End Cladding Layer Material for Second and Third Boards An under-cladding layer material, an over-cladding layer material and an end cladding layer material were prepared by mixing 35 parts by weight of bisphenoxyethanolfluorene glycidyl ether (Component (A)), 40 parts by weight of 3',4'-epoxycyclohexyl methyl 3,4-epoxycyclohexanecarboxylate (an alicyclic epoxy resin CELLOXIDE 2021P manufactured by Daicel Chemical Industries, Ltd.) (Component B), 25 parts by weight of (3',4'-epoxycyclohexane)methyl 3',4'-epoxycyclohexyl carboxylate (CELLOXIDE 2081 manufactured by Daicel Chemical Industries, Ltd.) (Component C), and 2 parts by weight of a 50% propione carbonate solution of 4,4'-bis[di($\beta$-hydroxyethoxy)phenylsulfinio] phenylsulfide bishexafluoroantimonate (Component D).

Core Material for First Board and End Core Material for Second and Third Boards

A core material and an end core material were prepared by dissolving 70 parts by weight of Component (A), 30 parts by weight of 1,3,3-tris{4-[2-(3-oxetanyl)]butoxyphenyl}butane and 1 part by weight of Component (D) in ethyl lactate.

Formation of Optical Waveguide and Positioning Guides for First Board

The under-cladding layer material was applied onto a surface of a polyethylene naphthalate (PEN) film (160 mm×160 mm×188 μm (thickness)) by an applicator, and then exposed to ultraviolet radiation at 2000 mJ/cm$^2$. Subsequently, a heat treatment was performed at 100° C. for 15 minutes. Thus, an under-cladding layer (having a thickness of 20 μm) was formed.

In turn, the core material was applied onto a surface of the under-cladding layer by an applicator, and dried at 100° C. for 15 minutes, whereby a photosensitive resin layer having a core formation region and positioning guide formation regions was formed. Then, a synthetic quartz-based chromium mask (photo mask) formed with an opening pattern conformable to a core/positioning guide pattern was placed above the photosensitive resin layer, which was in turn exposed to ultraviolet radiation emitted from the above at 4000 mJ/cm$^2$ by a proximity exposure method and heat-treated at 80° C. for 15 minutes. Subsequently, a development process was performed by using a γ-butyrolactone aqueous solution to dissolve away an unexposed portion, and then a heat treatment was performed at 120° C. for 30 minutes. Thus, a core (having a thickness of 50 μm and a length of 100 mm) and positioning guides (having a thickness of 50 μm) were formed. The core had opposite end portions progressively flared toward its ends. The flared end portions each had an end face having a width of 100 μm and a proximal portion having a width of 50 μm, and had a length of 30 mm. A middle portion of the core had a width of 50 μm. The positioning guides were spaced 100 μm from the opposite end faces of the core, and each had a length of 10 mm and a width of 300 μm. The paired elongated parallel projections of each of the positioning guides were spaced 80 μm from each other.

In turn, the over-cladding layer material was applied over the surface of the under-cladding layer as covering a portion of the core except for the positioning guides and the opposite end portions of the core by an applicator. After the resulting coating layer was exposed to ultraviolet radiation at 2000 mJ/cm$^2$, a heat treatment was performed at 120° C. for 15 minutes. Thus, an over-cladding layer (having a thickness of 25 μm as measured from the surface of the core) was formed. Thus, the optical waveguide of the first board was produced.

Preparation of Electric Circuit Boards for Second and Third Boards

Electric circuit boards for second and third boards were each prepared in the following manner. An insulating layer of a photosensitive polyimide resin (having a thickness of 10 μm) was formed in a predetermined pattern on one surface of a stainless steel plate (an SUS304 foil having a thickness of 25 μm) by a photolithography method. In turn, a seed layer of a copper/nickel/chromium alloy was formed on a surface of the insulating layer by sputtering. After dry resist films were bonded onto opposite surfaces of a laminate including the stainless steel plate, the insulating layer and the seed layer, a trench having a pattern conformal to the pattern of an electric circuit including a mount pad was formed in one of the dry resist films formed on the seed layer by a photolithography method, whereby a surface portion of the seed layer was exposed in the bottom of the trench. In turn, an electrolytic plating copper layer (having a thickness of 10 μm) was formed on the surface portion of the seed layer exposed in the bottom of the trench by electrolytic plating with copper. Then, the dry resist films were removed by a sodium hydroxide aqueous solution. Thereafter, a portion of the seed layer not formed with the electrolytic plating copper layer was removed by soft etching. Thus, a laminate including the residual electrolytic plating copper layer and the underlying seed layer was defined as the electric circuit. Further, dry resist films were bonded onto opposite surfaces of a laminate including the stainless steel plate, the insulating layer and the electric circuit, and then pattern openings for a light transmission through-hole and an alignment mark checking through-hole were formed in one of the dry resist films by a photolithography method, whereby portions of a rear surface of the stainless steel plate were exposed in the bottoms of the openings. Subsequently, the portions of the stainless steel plate exposed in the bottoms of the openings were etched with the use of a ferric chloride aqueous solution. Thus, the light transmission through-hole and the alignment mark checking through-hole were formed in the stainless steel plate. Thereafter, a gold/nickel alloy plating layer was formed on a surface of the mount pad.

Formation of Optical Waveguides and Alignment Marks for Second and Third Boards

An end cladding layer (having a thickness of 10 μm) was formed from the end cladding layer material on the other surface of the stainless steel plate (opposite from the surface formed with the electric circuit) in substantially the same manner as the under-cladding layer of the optical waveguide for the first board.

In turn, the end core material was applied onto a surface of the end cladding layer by an applicator, and then dried at 100° C. for 15 minutes, whereby a photosensitive resin layer having an end core formation region and an alignment mark formation region was formed. Subsequently, a quartz molding die having molding surfaces (recesses) conformal to the surface geometries of the end core and the alignment mark was prepared. Then, the molding die was positioned in predetermined positional relation with respect to the light transmission through-hole and the alignment mark checking through-hole formed in the electric circuit board, and pressed against the photosensitive resin layer. In this state, the photosensitive resin layer was exposed to ultraviolet radiation at 2000 mJ/cm$^2$ through the molding die, and then heat-treated at 80° C. for 15 minutes. Thereafter, the resulting product was demolded. Then, a development process was performed with the use of a γ-butyrolactone to dissolve away an unexposed portion, and a heat treatment was performed at 120° C. for 30 minutes. Thus, the end core (having a width of 50 μm, a thickness of 50 μm and a length of 15 mm) and the alignment mark (having a length of 1 mm, a width of 1 mm and a thickness of 50 μm) were formed. The alignment mark had a cross shape having a cross line width of 50 μm, a cross length of 700 μm, and a cross width of 700 μm. In this manner, the optical waveguide and the alignment mark were formed for each of the second and third boards.

Mounting of Light Emitting Element and Light Receiving Element

The electric circuit boards were each fixed onto a stage of a mounting device with the electric circuit thereof facing up. The light emitting element and the light receiving element were respectively mounted on the mount pads of the electric circuit boards by an ultrasonic flip chip bonding method. A VCSEL (available from Ulm Photonics GmbH and having a wavelength of 850 nm) was used as the light emitting element, and a PD (available from Roithner Laser Technik GmbH) was used as the light receiving element. In this manner, the second and third boards were produced.

Check of Second Board

An electric signal was applied to the electric circuit of the second board to cause the light emitting element to emit light, and light outputted from the one end face (connection surface) of the end core was checked. A second board with the output of the light detected was judged to be acceptable, and a second board with the output of the light not detected was judged to be defective.

Check of Third Board

Light was inputted to the one end face (connection surface) of the end core of the third board, and an electric signal outputted to the electric circuit from the light receiving element was checked. A third board with the electric signal detected was judged to be acceptable, and a third board with the electric signal not detected was judged to be defective.

Production of Opto-Electric Hybrid Module

Opposite side edges of the end cores of the second and third boards judged to be acceptable in the check were properly positioned by the positioning guides on the first board. In this state, the ends surfaces (connection surfaces) of the end cores were respectively connected to the opposite end faces of the core of the first board. Thereafter, the under-cladding layer material was applied around the connected portions, and exposed to ultraviolet radiation at 2000 mJ/cm², whereby the second and third boards were fixed to the first board. Thus, the opto-electric hybrid module was produced.

Although a specific form of embodiment of the instant invention has been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

What is claimed is:

1. An opto-electric hybrid module manufacturing method for manufacturing an opto-electric hybrid module including a middle portion, a light emitting end portion provided on one of opposite sides of the middle portion, and a light receiving end portion provided on the other side of the middle portion, the method comprising the steps of:

preparing a first board for the middle portion, the first board having an optical waveguide with a core extending from one end to the other end thereof;

preparing a second board for the light emitting end portion, the second board having an optical waveguide with a core connectable to one end of the core of the optical waveguide of the first board, an alignment mark provided at a predetermined position with respect to the core thereof, and a light emitting element mounted with reference to the alignment mark thereof;

preparing a third board for the light receiving end portion, the third board having an optical waveguide with a core connectable to the other end of the core of the optical waveguide of the first board, an alignment mark provided at a predetermined position with respect to the core thereof, and a light receiving element mounted with reference to the alignment mark thereof;

when the core of the first board is formed, forming a first set of positioning guides, a second set of positioning guides, and the core of the first board simultaneously from one photosensitive resin layer by a photolithography method using one photomask, the first set of positioning guides positioning opposite side edges of the core of the optical waveguide of the second board, the second set of positioning guides positioning opposite side edges of the core of the optical waveguide of the third board;

checking if light emitted from the light emitting element is outputted from an end of the core of the optical waveguide of the second board and, if the outputted light is detected, attaching the second board to the one side of the first board to connect the core of the optical waveguide of the second board to the core of the optical waveguide of the first board by using the first set of positioning guides; and checking if light inputted from an end of the core of the optical waveguide of the third board is received by the light receiving element and, if the received light is detected, attaching the third board to the other side of the first board to connect the core of the optical waveguide of the third board to the core of the optical waveguide of the first board by using the second set of positioning guides.

2. An opto-electric hybrid module comprising:

a middle portion, a light emitting end portion provided on one of opposite sides of the middle portion, a light receiving end portion provided on the other side of the middle portion;

wherein the middle portion having an optical waveguide with a core extending from one end to the other end thereof, a first set of positioning guides for positioning opposite side edges of a core of an optical waveguide of the light emitting end portion, and a second set of positioning guides for positioning opposite side edges of a core of an optical waveguide of the light receiving end portion, wherein the first set of positioning guides and the second set of positioning guides are formed of the same material as the material for forming the core of the middle portion, and the first set of positioning guides and the second set of positioning guides are formed on the same layer as the core and have the same height as the core, wherein the light emitting end portion having the optical waveguide with the core connectable to one end of the optical waveguide of the middle portion, an alignment mark provided at a predetermined position with respect to the core thereof, and a light emitting element mounted with reference to the alignment mark thereof, wherein the light receiving end portion having the optical waveguide with the core connectable to the other end of the core of the optical waveguide of the middle portion, an alignment mark provided at a predetermined position with respect to the core of the optical waveguide thereof, and a light receiving element mounted with reference to the alignment mark thereof;

wherein the core of the optical waveguide of the light emitting end portion is connected to the one end of the core of the optical waveguide of the middle portion with the opposite side edges of the core of the optical waveguide of the light emitting end portion being positioned by the first set of positioning guides, and the core of the optical waveguide of the light receiving end portion is connected to the other end of the core of the optical waveguide of the middle portion with the opposite side edges of the core of the optical waveguide of the light receiving end portion being positioned by the second set of positioning guides.

* * * * *